(12) United States Patent
Ye (10) Patent No.: US 10,739,922 B2
(45) Date of Patent: Aug. 11, 2020

(54) TOUCH CONTROL ELECTRODE STRUCTURE AND TOUCH CONTROL PANEL

(71) Applicant: WUHAN CHINA STAR OPTOELECTRONICS SEMICONDUCTOR DISPLAY TECHNOLOGY CO., LTD., Wuhan, Hubei (CN)

(72) Inventor: Jian Ye, Wuhan (CN)

(73) Assignee: Wuhan China Star Optoelectronics Semiconductor Display Technology Co., Ltd., Wuhan, Hubei (CN)

(*) Notice: Subject to any disclaimer, the term of this patent is extended or adjusted under 35 U.S.C. 154(b) by 90 days.

(21) Appl. No.: 16/074,788

(22) PCT Filed: May 11, 2018

(86) PCT No.: PCT/CN2018/086535
§ 371 (c)(1),
(2) Date: Aug. 2, 2018

(87) PCT Pub. No.: WO2019/200638
PCT Pub. Date: Oct. 24, 2019

(65) Prior Publication Data
US 2019/0324575 A1    Oct. 24, 2019

(30) Foreign Application Priority Data
Apr. 20, 2018 (CN) .......................... 2018 1 0361360

(51) Int. Cl.
*G06F 3/041* (2006.01)
*G06F 3/044* (2006.01)
(Continued)

(52) U.S. Cl.
CPC .......... *G06F 3/044* (2013.01); *G02F 1/13338* (2013.01); *G06F 2203/04111* (2013.01); *H01L 27/323* (2013.01)

(58) Field of Classification Search
None
See application file for complete search history.

(56) References Cited

U.S. PATENT DOCUMENTS

2016/0266691 A1* 9/2016 Jang ........................ G06F 3/044
2018/0342569 A1   11/2018 Chen et al.
(Continued)

FOREIGN PATENT DOCUMENTS

CN    104035627 A    9/2014
CN    104156098 A    11/2014
(Continued)

*Primary Examiner* — Adam R. Giesy
(74) *Attorney, Agent, or Firm* — Mark M. Friedman (57) ABSTRACT

The present disclosure provides a touch control electrode structure and a touch control panel. An insulating layer is disposed between the electrode layer and the electrical connection layer, and a plurality of through-holes are included in the insulating layer to correspond to the first portion and the second portion, so that the electrical connection layer, the first portion, and the second portion are electrically connected to each other by the through-holes, therefore connection resistance is decreased, touch sensitivity is increased, RC delay is decreased, and signal-to-noise ratio is increased.

20 Claims, 6 Drawing Sheets

(51) Int. Cl.
   *H01L 27/32* (2006.01)
   *G02F 1/1333* (2006.01)

(56) References Cited

U.S. PATENT DOCUMENTS

2018/0348932 A1* 12/2018 Lee .................. G06F 3/0416
2019/0064960 A1*  2/2019 Na ................... G06F 3/044

FOREIGN PATENT DOCUMENTS

| CN | 203930796 U | 11/2014 |
| CN | 104656967 A | 5/2015 |
| CN | 205049844 U | 2/2016 |
| CN | 105468184 A | 4/2016 |
| CN | 107195660 A | 9/2017 |
| JP | 2014153791 A | 8/2014 |

* cited by examiner

TOUCH CONTROL ELECTRODE STRUCTURE AND TOUCH CONTROL PANEL

FIELD OF INVENTION

The present disclosure relates to the field of liquid crystal display, and more particularly to a touch control electrode structure and a touch control panel.

BACKGROUND

With advance of display technology, touch control techniques are widely used in various types of display panels. Generally, there are two technical schemes to realize touch control functions of display panels. In one technical scheme, touch control panel and display panel are manufactured independently, and then the touch control panel is attached to an upper surface of the display panel, thus producing an integrated touch control panel. However, this technical scheme increases thickness of the touch control panel and requires an additional attachment process. In the other technical scheme, touch control electrodes are formed on a thin-film encapsulation layer of the display panel, to realize touch control functions of display panels.

However, for the touch control panel produced by forming touch control electrode structures on a thin-film encapsulation layer of the display panels, it is by formation of conductive bridge that electrical connection between electrodes is established. These conductive bridges are of a stripe structure having small area, therefore areas at two ends of a conductive bridge, where it contacts electrodes, are small as well. This causes high connection resistance or open circuit, thus decreasing touch sensitivity, increasing RC delay, and decreasing signal-to-noise ratio.

SUMMARY OF DISCLOSURE

The present disclosure provides a touch control electrode structure and a touch control panel which achieves the advantageous effects of decreased connection resistance, increased touch sensitivity, decreased RC delay, and increased signal-to-noise ratio.

In a first aspect, the present disclosure provides a touch control electrode structure, comprising:
  a substrate;
  a plurality of touch control units disposed on the substrate, wherein each of the touch control units comprises:
    an electrode layer including a first patterned electrode and a second patterned electrode, wherein the second patterned electrode is divided by the first patterned electrode into a first portion and a second portion;
    an electrical connection layer electrically connected to the first portion and the second portion, and isolated from the electrode layer in space; and
    an insulating layer disposed between the electrode layer and the electrical connection layer, wherein the insulating layer includes a plurality of through-holes that correspond to the first portion and the second portion, such that the electrical connection layer, the first portion, and the second portion are electrically connected to each other by the through-holes;
  wherein the electrical connection layer has a mesh structure, and the mesh structure includes a plurality of connection lines crossing each other and electrically connected to each other, and the electrode layer is made of a transparent conductive film.

In the touch control electrode structure of the present disclosure, the connection lines electrically connect the first portion with the second portion via the through-holes.

In the touch control electrode structure of the present disclosure, the through-holes corresponding to the first portion in the insulating layer and the through-holes corresponding to the second portion in the insulating layer correspond to each other.

In the touch control electrode structure of the present disclosure, the electrode layer, the insulating layer, and the electrical connection layer are disposed on the substrate in turn from bottom to top.

In the touch control electrode structure of the present disclosure, the electrical connection layer, the insulating layer, and the electrode layer are disposed on the substrate in turn from bottom to top.

In the touch control electrode structure of the present disclosure, the electrical connection layer is made of metal.

In a second aspect, the present disclosure provides a touch control electrode structure, comprising:
  a substrate;
  a plurality of touch control units disposed on the substrate, wherein each of the touch control units comprises:
    an electrode layer including a first patterned electrode and a second patterned electrode, wherein the second patterned electrode is divided by the first patterned electrode into a first portion and a second portion;
    an electrical connection layer electrically connected to the first portion and the second portion, and isolated from the electrode layer in space; and
    an insulating layer disposed between the electrode layer and the electrical connection layer, wherein the insulating layer includes a plurality of through-holes that correspond to the first portion and the second portion, such that the electrical connection layer, the first portion, and the second portion are electrically connected to each other by the through-holes.

In the touch control electrode structure of the present disclosure, the electrical connection layer has a mesh structure, and the mesh structure includes a plurality of connection lines crossing each other and electrically connected to each other.

In the touch control electrode structure of the present disclosure, the connection lines electrically connect the first portion with the second portion via the through-holes.

In the touch control electrode structure of the present disclosure, the through-holes corresponding to the first portion in the insulating layer and the through-holes corresponding to the second portion in the insulating layer correspond to each other.

In the touch control electrode structure of the present disclosure, the electrode layer, the insulating layer, and the electrical connection layer are disposed on the substrate in turn from bottom to top.

In the touch control electrode structure of the present disclosure, the electrical connection layer, the insulating layer, and the electrode layer are disposed on the substrate in turn from bottom to top.

In the touch control electrode structure of the present disclosure, the electrode layer is made of a transparent conductive film.

In the touch control electrode structure of the present disclosure, the electrical connection layer is made of metal.

In a third aspect, the present disclosure provides a touch control panel including a touch control electrode structure, the touch control electrode structure comprising:

a substrate;
a plurality of touch control units disposed on the substrate, wherein each of the touch control units comprises:
an electrode layer including a first patterned electrode and a second patterned electrode, wherein the second patterned electrode is divided by the first patterned electrode into a first portion and a second portion;
an electrical connection layer electrically connected to the first portion and the second portion, and isolated from the electrode layer in space; and
an insulating layer disposed between the electrode layer and the electrical connection layer, wherein the insulating layer includes a plurality of through-holes that correspond to the first portion and the second portion, such that the electrical connection layer, the first portion, and the second portion are electrically connected to each other by the through-holes.

In the touch control panel of the present disclosure, the electrical connection layer has a mesh structure, and the mesh structure includes a plurality of connection lines crossing each other and electrically connected to each other.

In the touch control panel of the present disclosure, the connection lines electrically connect the first portion with the second portion via the through-holes.

In the touch control panel of the present disclosure, the through-holes corresponding to the first portion in the insulating layer and the through-holes corresponding to the second portion in the insulating layer correspond to each other.

In the touch control panel of the present disclosure, the electrode layer, the insulating layer, and the electrical connection layer are disposed on the substrate in turn from bottom to top.

In the touch control panel of the present disclosure, the electrical connection layer, the insulating layer, and the electrode layer are disposed on the substrate in turn from bottom to top.

In the touch control electrode structure and the touch control panel of the present disclosure, an insulating layer is disposed between the electrode layer and the electrical connection layer, and a plurality of through-holes are included in the insulating layer to correspond to the first portion and the second portion, so that the electrical connection layer, the first portion, and the second portion are electrically connected to each other by the through-holes, therefore connection resistance is decreased, touch sensitivity is increased, RC delay is decreased, and signal-to-noise ratio is increased.

BRIEF DESCRIPTION OF DRAWINGS

To explain in detail the technical schemes of the embodiments or existing techniques, drawings that are used to illustrate the embodiments or existing techniques are provided. The illustrated embodiments are just a part of those of the present disclosure. It is easy for any person having ordinary skill in the art to obtain other drawings without labor for inventiveness.

DETAILED DESCRIPTION

The following embodiments refer to the accompanying drawings for exemplifying specific implementable embodiments of the present disclosure. Moreover, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, the same reference symbol represents the same or similar components.

Figure 1:
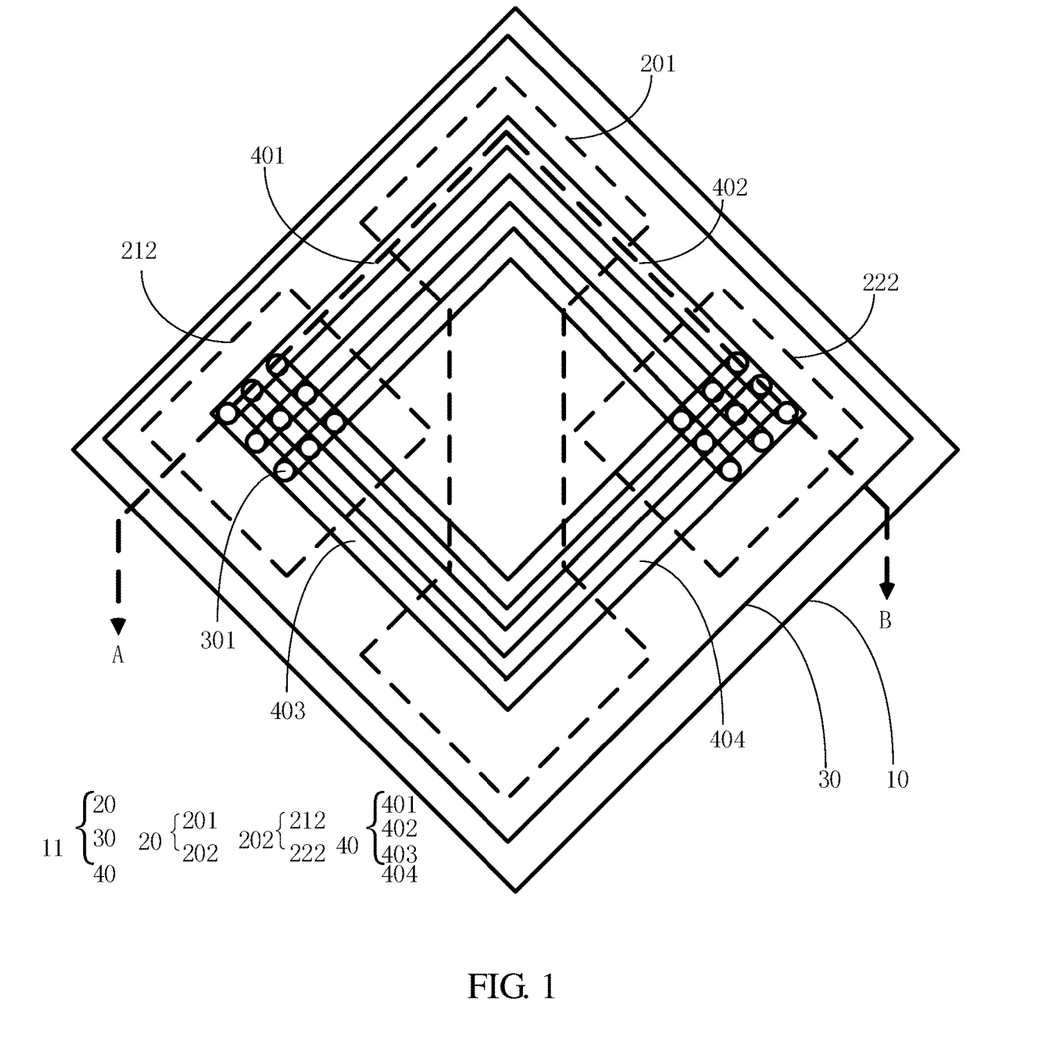
FIG. 1 is a schematic diagram showing a top view of a touch control electrode structure according to one embodiment of the present disclosure.
Figure 2:
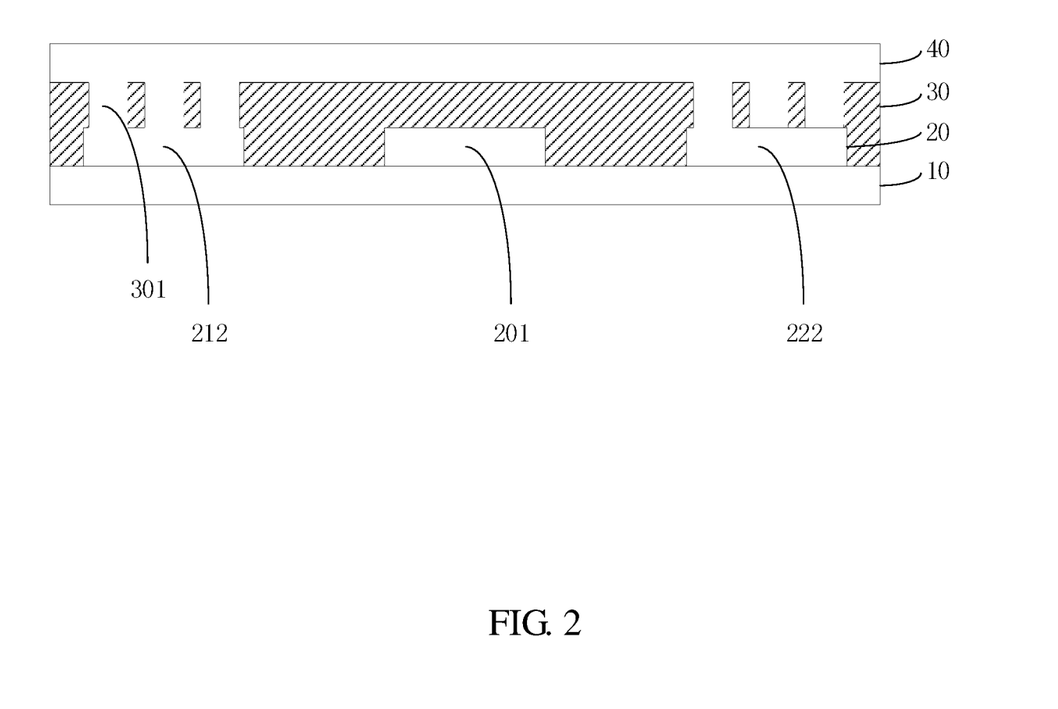
FIG. 2 is a cross-sectional view of the touch control electrode structure of FIG. 1 along line A-B.

Please refer to FIGS. 1 and 2. FIG. 1 is a schematic diagram showing a top view of a touch control electrode structure according to one embodiment of the present disclosure. FIG. 2 is a cross-sectional view of the touch control electrode structure of FIG. 1 along line A-B. The touch control electrode structure in the embodiment of the present disclosure includes a substrate 10 and a plurality of touch control units 11 disposed on the substrate 10.

The substrate 10 in this embodiment refers to a base element used to support the touch control electrode structure. Taking an active-matrix organic light-emitting diode (AMOLED) panel as an example, the AMOLED panel includes a base plate, a thin-film transistor layer, a pixel-defining layer, an encapsulation layer, and a touch control electrode structure, which are stacked in turn from bottom to top. The base plate, the thin-film transistor layer, the pixel-defining layer, and the encapsulation layer disposed under the touch control electrode structure constitute a substrate 10 in the embodiment of the present disclosure.

Referring to FIGS. 1 and 2, each of the touch control units 11 includes an electrode layer 20, an electrical connection layer 40, and an insulating layer 30. The electrode layer 20 includes a first patterned electrode 201 and a second patterned electrode 202, and the second patterned electrode 202 is divided by the first patterned electrode 201 into a first portion 212 and a second portion 222. The electrical connection layer 40 is electrically connected to the first portion 212 and the second portion 222, and is isolated from the electrode layer 20 in space. The insulating layer 30 is disposed between the electrode layer 20 and the electrical connection layer 40. The insulating layer 30 includes a plurality of through-holes 301 that correspond to the first portion 212 and the second portion 222, such that the electrical connection layer 40, the first portion 212, and the second portion 222 are electrically connected to each other by the through-holes 301.

As shown in FIG. 1, the electrical connection layer 40 has a mesh structure, and the mesh structure includes a plurality of connection lines crossing each other and electrically connected to each other. The connection lines electrically connect the first portion 212 with the second portion 222 via the through-holes 301. Specifically, the connection lines includes a plurality of first connection lines 401, a plurality of second connection lines 402, a plurality of third connection lines 403, and a plurality of fourth connection lines 404.

The first connection lines 401 and the second connection lines 402 cross each other and are electrically connected to each other. The third connection lines 403 and the fourth connection lines 404 cross each other and are electrically connected to each other. In other words, the first connection lines 401, the second connection lines 402, the third connection lines 403, and the fourth connection lines 404 constitute a mesh. Taking an active-matrix organic light-emitting diode (AMOLED) panel as an example, the electrical connection layer of each touch control unit 11 has a mesh structure according to one embodiment of the present disclosure, therefore the electrical connection layer having a mesh structure is included in the touch control units 11. Such design enables pixel illumination area clear, and thus illumination display effect of AMOLED panel is not affected.

The through-holes 301 corresponding to the first portion 212 in the insulating layer 30 and the through-holes 301 corresponding to the second portion 222 in the insulating layer 30 correspond to each other. That is, the shapes, quantities, and arrangements of the through-holes 301 corresponding to the first portion 212 in the insulating layer 30 are consistent with the shapes, quantities, and arrangements of the through-holes 301 corresponding to the second portion 222 in the insulating layer 30. In particular, all of the connection lines of the electrical connection layer 40 are electrically connected to the first portion 212 and the second portion 222 via the through-holes 301.

As shown in FIGS. 1 and 2, in this embodiment of the present disclosure, the electrode layer 20, the insulating layer 30, and the electrical connection layer 40 are disposed on the substrate 10 in turn from bottom to top. In addition, in one embodiment of the present disclosure, the electrode layer 20 is made of a transparent conductive film, and the electrical connection layer 40 is made of metal.

Figure 3:
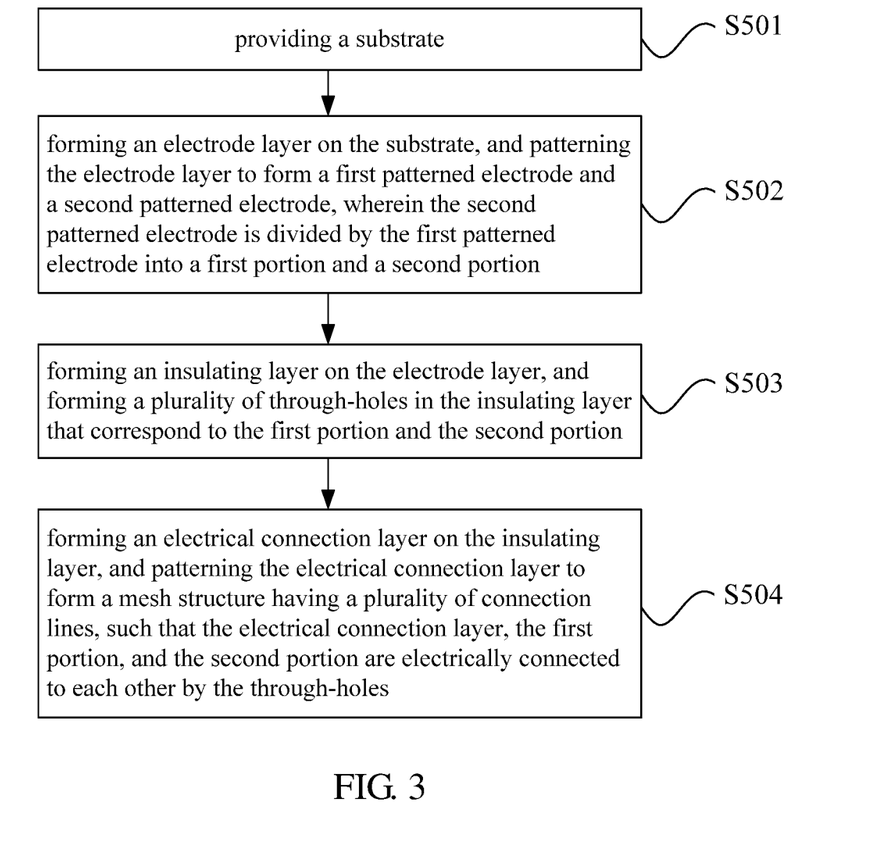
FIG. 3 is a schematic diagram showing a flowchart of a method for manufacturing a touch control electrode structure according to one embodiment of the present disclosure.

Please refer to FIG. 3, which is a schematic diagram showing a flowchart of a method for manufacturing a touch control electrode structure according to one embodiment of the present disclosure. As shown in FIG. 3, the method for manufacturing a touch control electrode structure according to one embodiment of the present disclosure includes:

a step S501 of providing a substrate;

a step S502 of forming an electrode layer on the substrate, and patterning the electrode layer to form a first patterned electrode and a second patterned electrode, wherein the second patterned electrode is divided by the first patterned electrode into a first portion and a second portion;

a step S503 of forming an insulating layer on the electrode layer, and forming a plurality of through-holes in the insulating layer to correspond to the first portion and the second portion; and a step S504 of forming an electrical connection layer on the insulating layer, and patterning the electrical connection layer to form a mesh structure having a plurality of connection lines, such that the electrical connection layer, the first portion, and the second portion are electrically connected to each other by the through-holes.

In the method for manufacturing a touch control electrode structure according to one embodiment of the present disclosure, please refer to the above described touch control electrode structure for details of each step thereof, which is omitted to avoid redundancy.

In the touch control electrode structure and the touch control panel of the present disclosure, an insulating layer is disposed between the electrode layer and the electrical connection layer, and a plurality of through-holes are included in the insulating layer to correspond to the first portion and the second portion, so that the electrical connection layer, the first portion, and the second portion are electrically connected to each other by the through-holes, therefore connection resistance is decreased, touch sensitivity is increased, RC delay is decreased, and signal-to-noise ratio is increased.

Figure 4:
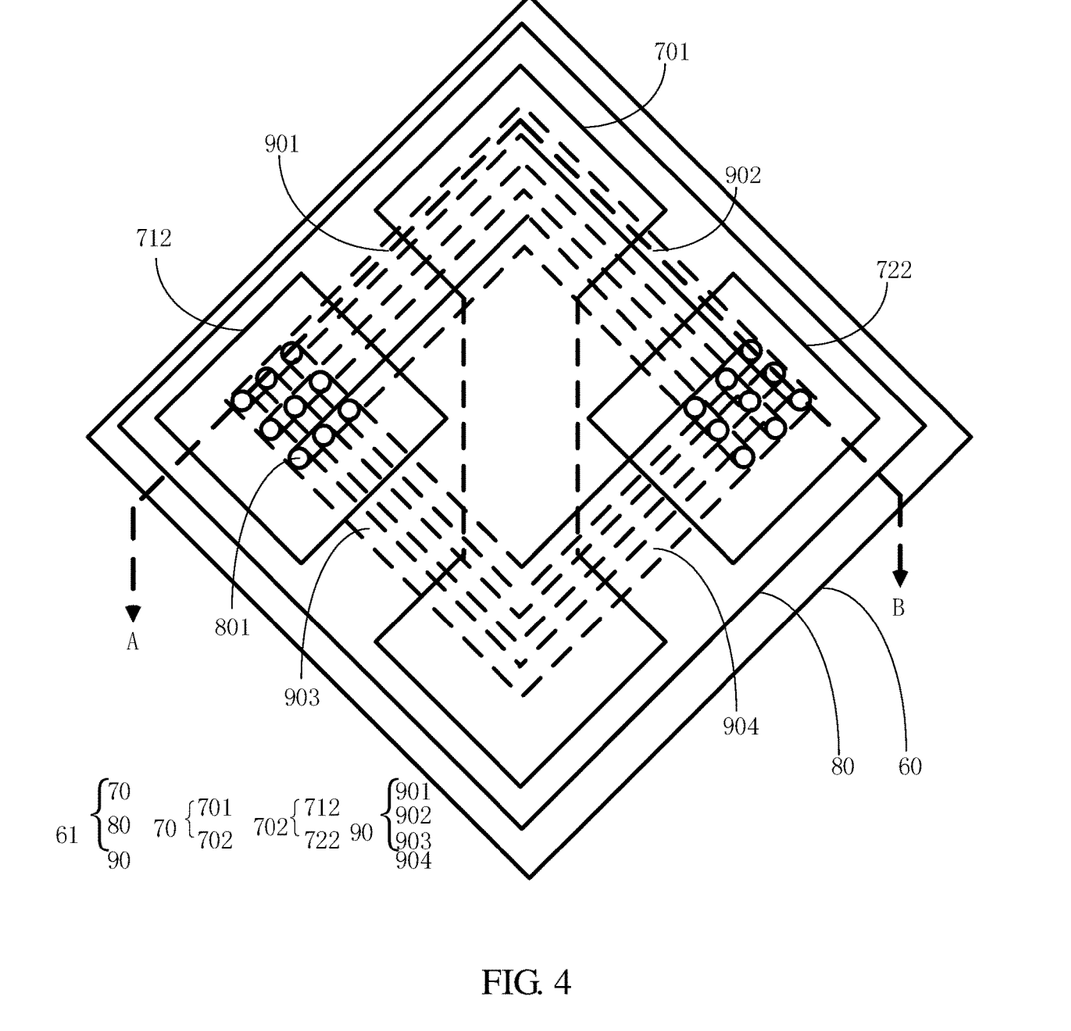
FIG. 4 is a schematic diagram showing a top view of a touch control electrode structure according to another embodiment of the present disclosure.
Figure 5:
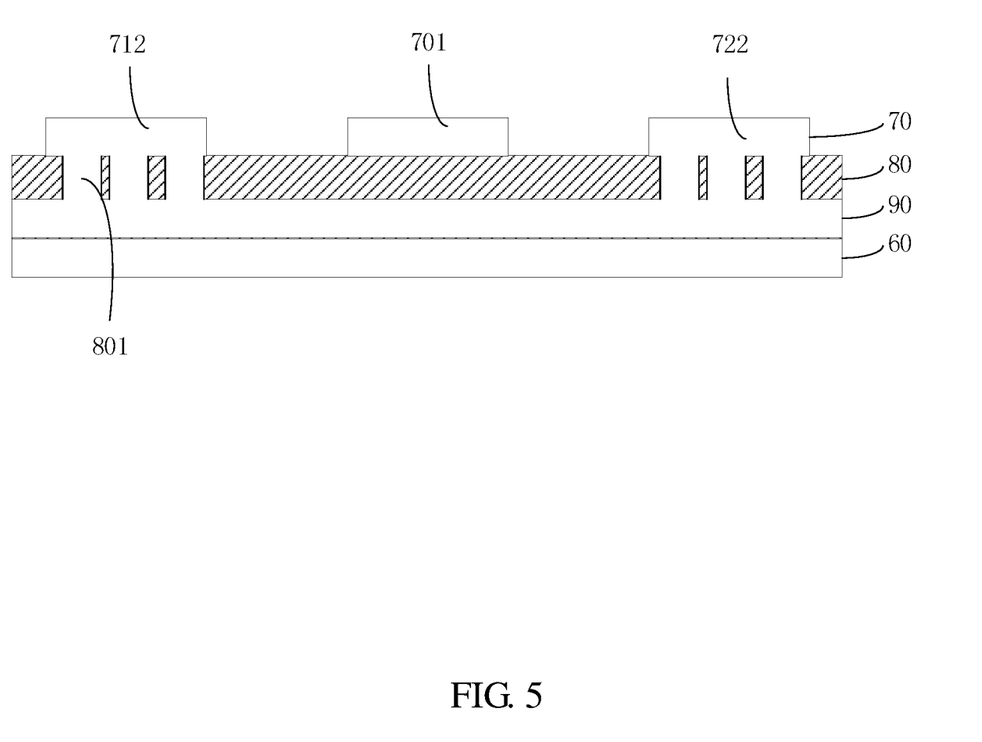
FIG. 5 is a cross-sectional view of the touch control electrode structure of FIG. 4 along line A-B.

Please refer to FIGS. 4 and 5. FIG. 4 is a schematic diagram showing a top view of a touch control electrode structure according to another embodiment of the present disclosure. FIG. 5 is a cross-sectional view of the touch control electrode structure of FIG. 4 along line A-B. The touch control electrode structure in the embodiment of the present disclosure includes a substrate 60 and a plurality of touch control units 61 disposed on the substrate 60.

The substrate 60 in this embodiment refers to a base element used to support the touch control electrode structure. Taking an active-matrix organic light-emitting diode (AMOLED) panel as an example, the AMOLED panel includes a base plate, a thin-film transistor layer, a pixel-defining layer, an encapsulation layer, and a touch control electrode structure, which are stacked in turn from bottom to top. The base plate, the thin-film transistor layer, the pixel-defining layer, and the encapsulation layer disposed under the touch control electrode structure constitute a substrate 60 in the embodiment of the present disclosure.

Referring to FIGS. 4 and 5, each of the touch control units 61 includes an electrode layer 70, an electrical connection layer 90, and an insulating layer 80. The electrode layer 70 includes a first patterned electrode 701 and a second patterned electrode 702, and the second patterned electrode 702 is divided by the first patterned electrode 701 into a first portion 712 and a second portion 722. The electrical connection layer 90 is electrically connected to the first portion 712 and the second portion 722, and is isolated from the electrode layer 70 in space. The insulating layer 80 is disposed between the electrode layer 70 and the electrical connection layer 90. The insulating layer 80 includes a plurality of through-holes 801 that correspond to the first portion 712 and the second portion 722, such that the electrical connection layer 90, the first portion 712, and the second portion 722 are electrically connected to each other by the through-holes 801.

As shown in FIG. 4, the electrical connection layer 90 has a mesh structure, and the mesh structure includes a plurality of connection lines crossing each other and electrically connected to each other. The connection lines electrically connect the first portion 712 with the second portion 722 via the through-holes 801. Specifically, the connection lines includes a plurality of first connection lines 901, a plurality of second connection lines 902, a plurality of third connection lines 903, and a plurality of fourth connection lines 904. The first connection lines 901 and the second connection lines 902 cross each other and are electrically connected to each other. The third connection lines 903 and the fourth connection lines 904 cross each other and are electrically connected to each other. In other words, the first connection lines 901, the second connection lines 902, the third connection lines 903, and the fourth connection lines 904 constitute a mesh. Taking an active-matrix organic light-emitting diode (AMOLED) panel as an example, the electrical connection layer of each touch control unit 61 has a mesh structure according to one embodiment of the present disclosure, therefore the electrical connection layer having a mesh structure is included in the touch control units 61. Such design enables pixel illumination area clear, and thus illumination display effect of AMOLED panel is not affected.

The through-holes 801 corresponding to the first portion 712 in the insulating layer 80 and the through-holes 801 corresponding to the second portion 722 in the insulating layer 80 correspond to each other. That is, the shapes, quantities, and arrangements of the through-holes 801 corresponding to the first portion 712 in the insulating layer 80 are in consistency with the shapes, quantities, and arrangements of the through-holes 801 corresponding to the second portion 722 in the insulating layer 80. In particular, all of the connection lines of the electrical connection layer 90 are electrically connected to the first portion 712 and the second portion 722 via the through-holes 801.

As shown in FIGS. 4 and 5, in this embodiment of the present disclosure, the electrical connection layer 90, the insulating layer 80, and the electrode layer 70 are disposed on the substrate 60 in turn from bottom to top. In addition, in one embodiment of the present disclosure, the electrode layer 70 is made of a transparent conductive film, and the electrical connection layer 90 is made of metal.

Figure 6:
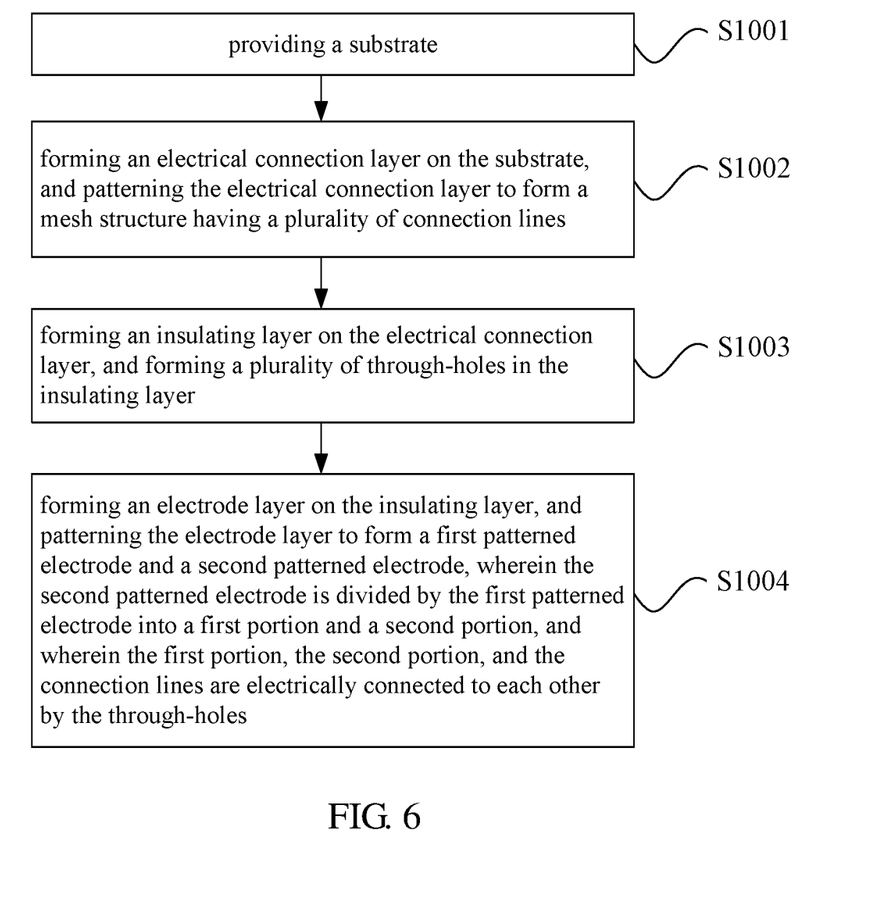
FIG. 6 is a schematic diagram showing a flowchart of a method for manufacturing a touch control electrode structure according to another embodiment of the present disclosure.

Please refer to FIG. 6, which is a schematic diagram showing a flowchart of a method for manufacturing a touch control electrode structure according to another embodiment of the present disclosure. As shown in FIG. 6, the method for manufacturing a touch control electrode structure according to this embodiment of the present disclosure includes:

a step S1001 of providing a substrate;

a step S1002 of forming an electrical connection layer on the substrate, and patterning the electrical connection layer to form a mesh structure having a plurality of connection lines;

a step S1003 of forming an insulating layer on the electrical connection layer, and forming a plurality of through-holes in the insulating layer; and a step S1004 of forming an electrode layer on the insulating layer, and patterning the electrode layer to form a first patterned electrode and a second patterned electrode, wherein the second patterned electrode is divided by the first patterned electrode into a first portion and a second portion, and wherein the first portion, the second portion, and the connection lines are electrically connected to each other by the through-holes.

In the method for manufacturing a touch control electrode structure according to this embodiment of the present disclosure, please refer to the above described touch control electrode structure for details of each step thereof, which is omitted to avoid redundancy.

In the touch control electrode structure and the touch control panel of the present disclosure, an insulating layer is disposed between the electrode layer and the electrical connection layer, and a plurality of through-holes are included in the insulating layer to correspond to the first portion and the second portion, so that the electrical connection layer, the first portion, and the second portion are electrically connected to each other by the through-holes, therefore connection resistance is decreased, touch sensitivity is increased, RC delay is decreased, and signal to noise ratio is increased.

In addition, the present disclosure provides a touch control panel including the touch control electrode structure as described above. Description of the touch control electrode structure is omitted to avoid redundancy. Please refer to the above embodiments for more details of the touch control electrode structure.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A touch control electrode structure, comprising:
   a substrate;
   a plurality of touch control units disposed on the substrate, wherein each of the touch control units comprises:
      an electrode layer including a first patterned electrode and a second patterned electrode, wherein the second patterned electrode is divided by the first patterned electrode into a first portion and a second portion;
      an electrical connection layer electrically connected to the first portion and the second portion, and isolated from the electrode layer in space; and
      an insulating layer disposed between the electrode layer and the electrical connection layer, wherein the insulating layer includes a plurality of through-holes that correspond to the first portion and the second portion, such that the electrical connection layer, the first portion, and the second portion are electrically connected to each other by the through-holes;
   wherein the electrical connection layer has a mesh structure, and the mesh structure includes a plurality of first connection lines, a plurality of second connection lines, a plurality of third connection lines, and a plurality of fourth connection lines, wherein the first connection lines and the second connection lines cross each other and are electrically connected to each other, the third connection lines and the fourth connection lines cross each other and are electrically connected to each other, so that the first connection lines, the second connection lines, the third connection lines, and the fourth connection lines constitute the mesh structure, and the electrode layer is made of a transparent conductive film.

2. The touch control electrode structure according to claim 1, wherein the first connection lines, the second connection lines, the third connection lines, and the fourth connection lines electrically connect the first portion with the second portion via the through-holes.

3. The touch control electrode structure according to claim 1, wherein the through-holes corresponding to the first portion in the insulating layer and the through-holes corresponding to the second portion in the insulating layer correspond to each other.

4. The touch control electrode structure according to claim 1, wherein the electrode layer, the insulating layer, and the electrical connection layer are disposed on the substrate in turn from bottom to top.

5. The touch control electrode structure according to claim 1, wherein the electrical connection layer, the insulating layer, and the electrode layer are disposed on the substrate in turn from bottom to top.

6. The touch control electrode structure according to claim 1, wherein the electrical connection layer is made of metal.

7. A touch control electrode structure, comprising:
   a substrate;
   a plurality of touch control units disposed on the substrate, wherein each of the touch control units comprises:
      an electrode layer including a first patterned electrode and a second patterned electrode, wherein the second patterned electrode is divided by the first patterned electrode into a first portion and a second portion;
      an electrical connection layer electrically connected to the first portion and the second portion, and isolated from the electrode layer in space, wherein the electrical connection layer includes a plurality of first connection lines, a plurality of second connection lines, a plurality of third connection lines, and a plurality of fourth connection lines, wherein the first connection lines and the second connection lines cross each other and are electrically connected to each other, the third connection lines and the fourth connection lines cross each other and are electrically connected to each other; and an insulating layer disposed between the electrode layer and the electrical connection layer, wherein the insulating layer includes a plurality of through-holes that correspond to the first portion and the second portion, such that the electrical connection layer, the first portion, and the second portion are electrically connected to each other by the through-holes.

8. The touch control electrode according to claim 7, wherein the electrical connection layer has a mesh structure, and the first connection lines, the second connection lines, the third connection lines, and the fourth connection lines constitute the mesh structure.

9. The touch control electrode structure according to claim 7, wherein the first connection lines, the second connection lines, the third connection lines, and the fourth connection lines electrically connect the first portion with the second portion via the through-holes.

10. The touch control electrode structure according to claim 7 wherein the through-holes corresponding to the first portion in the insulating layer and the through-holes corresponding to the second portion in the insulating layer correspond to each other.

11. The touch control electrode structure according to claim 7, wherein the electrode layer, the insulating layer, and the electrical connection layer are disposed on the substrate in turn from bottom to top.

12. The touch control electrode structure according to claim 7, wherein the electrical connection layer, the insulating layer, and the electrode layer are disposed on the substrate in turn from bottom to top.

13. The touch control electrode structure according to claim 7, wherein the electrode layer is made of a transparent conductive film.

14. The touch control electrode structure according to claim 7, wherein the electrical connection layer is made of metal.

15. A touch control panel including a touch control electrode structure, the touch control electrode structure comprising:

a substrate;

a plurality of touch control units disposed on the substrate, wherein each of the touch control units comprises:

an electrode layer including a first patterned electrode and a second patterned electrode, wherein the second patterned electrode is divided by the first patterned electrode into a first portion and a second portion;

an electrical connection layer electrically connected to the first portion and the second portion, and isolated from the electrode layer in space, wherein the electrical connection layer includes a plurality of first connection lines, a plurality of second connection lines, a plurality of third connection lines, and a plurality of fourth connection lines, wherein the first connection lines and the second connection lines cross each other and are electrically connected to each other, the third connection lines and the fourth connection lines cross each other and are electrically connected to each other; and an insulating layer disposed between the electrode layer and the electrical connection layer, wherein the insulating layer includes a plurality of through-holes that correspond to the first portion and the second portion, such that the electrical connection layer, the first portion, and the second portion are electrically connected to each other by the through-holes.

16. The touch control panel according to claim 15, wherein the electrical connection layer has a mesh structure, and the first connection lines, the second connection lines, the third connection lines, and the fourth connection lines constitute the mesh structure.

17. The touch control panel according to claim 16, wherein the first connection lines, the second connection lines, the third connection lines, and the fourth connection lines electrically connect the first portion with the second portion via the through-holes.

18. The touch control panel according to claim 16, wherein the through-holes corresponding to the first portion in the insulating layer and the through-holes corresponding to the second portion in the insulating layer correspond to each other.

19. The touch control panel according to claim 15, wherein the electrode layer, the insulating layer, and the electrical connection layer are disposed on the substrate in turn from bottom to top.

20. The touch control panel according to claim 15, wherein the electrical connection layer, the insulating layer, and the electrode layer are disposed on the substrate in turn from bottom to top.

* * * * *